United States Patent [19]

Hewig et al.

[11] Patent Number: 4,612,410
[45] Date of Patent: Sep. 16, 1986

[54] CONTACT SYSTEM FOR THIN FILM SOLAR CELLS

[75] Inventors: Gert Hewig, Alzenau; Hans Huschka, Hanau; Bernd Schurich, Bruchkoebel; Jörg Wörner, Grosskrotzenburg, all of Fed. Rep. of Germany

[73] Assignee: Nukem GmbH, Hanau, Fed. Rep. of Germany

[21] Appl. No.: 665,345

[22] Filed: Oct. 26, 1984

[30] Foreign Application Priority Data

Oct. 29, 1983 [DE] Fed. Rep. of Germany ....... 3339417

[51] Int. Cl.⁴ .............................................. H01L 31/06
[52] U.S. Cl. .................... 136/256; 136/260; 136/265; 357/30; 357/65; 357/67; 357/71
[58] Field of Search ...... 136/256, 260, 265; 357/30, 65, 67, 71; 29/572; 427/88

[56] References Cited

U.S. PATENT DOCUMENTS

| | | | |
|---|---|---|---|
| 4,167,805 | 9/1979 | Castel | 29/572 |
| 4,251,286 | 2/1981 | Barnett | 136/260 |
| 4,267,398 | 5/1981 | Rothwarf | 136/256 |
| 4,283,591 | 8/1981 | Boër | 136/256 |
| 4,366,336 | 12/1982 | Donaghey | 136/256 |

*Primary Examiner*—Aaron Weisstuch
*Attorney, Agent, or Firm*—Cushman, Darby & Cushman

[57] ABSTRACT

A contact system for thin film solar cells, which guarantees that charge carrier transport without a barrier layer takes place from the semiconductor layer facing the light source to the front contact in such a manner that, among others, long term negative influences by the front contact on the semiconductor layer will not take place. To this end the front contact is rendered passive against the semiconductor layer by modifying its chemical potential, at least in the actual contact area, to be matched to the chemical potential of the semiconductor layer, or by forming a chemically inert system acting as a reaction barrier between the front contact and the semiconductor layer.

3 Claims, 3 Drawing Figures

CONTACT SYSTEM FOR THIN FILM SOLAR CELLS

BACKGROUND OF THE INVENTION

The invention relates to a contact system for thin film solar cells with an upper semiconductor layer, to which is applied to a front ohmic contact.

Thin film solar cells are essentially composed of an electrically conductive base layer deposited on a carrier, a first p-type or n-type semiconductor layer applied to said base, a second n-type or p-type semiconductor layer arranged thereon, to which an electrically conducting front contact, preferably a grid, is applied. Crystalline or amorphous silicon can be used as a basic material. As compared to a-Si solar cells, it is true that crystalline cells do have a higher efficiency but their manufacture is considerably more expensive and thus more costly than that of the a-Si solar cells. Further, there are copper sulfide-cadmium sulfide solar cells, which although less efficient than the known monocrystalline Si solar cells, likewise offer the considerable advantage of permitting a cost saving fabrication. Therefore, $Cu_2S/CdS$ solar cells are of increasing interest for the terrestrial field.

The efficiency of a solar cell, among other factors, is also dependent on the fact that there is no barrier layer existing between the front contact and the upper semiconductor layer facing the light source. It must be guaranteed that the part of the surface of the semiconductor layer in contact with the front contact, which very often is made of copper, is not subject to any influences which would impair the efficiency of the solar cell.

In order to prevent this it is known, as far as copper sulfide-cadmium sulfide solar cells with a front contact made of copper are concerned, to apply at first a gold layer to the semiconductor layer facing the light source, which offers a good ohmic contact. However, since the gold layer does not form a permeation barrier to the front side copper contact, this does not prevent copper from diffusing into the copper sulfide layer and consequently changing the stoichiometry of the copper layer. Thus, it is necessary to deposit a nickel layer on the gold layer prior to applying the copper front contact. The nickel layer then serves as a permeation barrier. It is obvious that the fabrication of such a contact system is expensive and cost-consuming so that another contact system would appear to be urgently required, especially for the large-scale manufacture of thin film solar cells.

OBJECT OF THE INVENTION

It is therefore the object of the present invention to design a contact system of the above described kind in such a manner that it is guaranteed that charge carrier transport without a barrier layer takes place from the semiconductor layer to the front contact. Also, according to the method of the invention the contact system shall be easy to produce, and it is guaranteed that the semiconductor layer will not be submitted to a long term adverse influence due to the front contact.

According to the invention this object is achieved in that the front contact is rendered passive relative to the semiconductor layer by adapting its chemical potential at least in the contact region to the chemical potential of the semiconductor layer, or by building up a chemically inserted system as a reaction barrier between the front contact and the semiconductor layer.

By the special selection of the chemical potential of the area of the front contact coming in contact with the semiconductor layer facing the light source it is guaranteed that no foreign atoms can diffuse into the semiconductor layer, which would negatively influence the semiconductor layer, while, however, at the same time good ohmic contact is maintained. This can be effected e.g., with a copper sulfide-cadmium sulfide solar cell with a front contact made of copper in such a manner that at least those areas of the copper contact coming in contact with the semiconductor layer are sulfidized or oxidized, according to whether the semiconductor layer facing the light source is made only of $Cu_{2-x}S$ or has an additional copper oxide layer $Cu_{2-y}O$.

An alternative solution provides that between the front contact and the semiconductor layer facing the light source an intermediate layer, preferably a paste, is arranged, which should be selectively applied and have a dimension preferably smaller than the projection of the front contact on the semiconductor layer. In the case of a copper sulfide-cadmium sulfide solar cell this paste can be graphite/soot conducting paste or a gilded graphite/soot conducting paste or a gold conducting paste, which is selectively applied and has a thickness of preferably 1 to 10 $\mu$m.

Preferably the front contact itself can be composed of wires (dimension 100 $\mu$m) arranged parallelly or almost parallelly to each other, which at least in the contact region of the semiconductor layer are made of the same material as said layer. As an alternative thereto, a contact paste or the like can be arranged between the wires and the semiconductor layer, defining a reaction barrier between the front contact and the semiconductor layer. The wires themselves can have a diameter of preferably 50 to 200 $\mu$m.

A method for the fabrication of a contaction system, especially one of the above described kind, excels by the fact that the front contact, prior to being arranged on the semiconductor layer facing the light source, is chemically adapted to the semiconductor layer at least in the contact area. This can be effected e.g., with a copper sulfide-cadmium sulfide solar cell having copper as a front contact, in such a manner that the copper in the contact region to the semiconductor layer is sulfidized or oxidized prior to its application to the semiconductor layer, in that the wires are exposed to a $H_2S$, or respectively, to an oxygen atmosphere under defined temperature conditions. Alternatively, one could proceed by a wet process (ammonium sulfide or alkali). Another possibility of making the contacting system consists of depositing an adhesive forming a reaction barrier all over the surface of the semiconductor layer facing the light source, the front contact is selectively applied to the adhesive, and subsequently the areas existing between the front contact points are dissolved and removed. In this respect, adhesives based on water soluble soot/graphite paste have proven to be especially advantageous.

Still another possibility of producing the contacting system consists in selectively applying a paste as a resist pattern to a conducting layer, subsequently removing the conductor layer between the patterned resist, and the resist is deposited on the semiconductor layer as a reaction barrier. As the conducting layer, copper foil is preferred and soot/graphite is preferred as the paste.

BRIEF DESCRIPTION OF THE DRAWINGS

Further details, advantages and characteristics of the invention will appear from the claims as well as also in connection with the description of the preferred embodiment example shown in the drawings, where

DETAILED DESCRIPTION OF THE DRAWINGS

Figure 1:
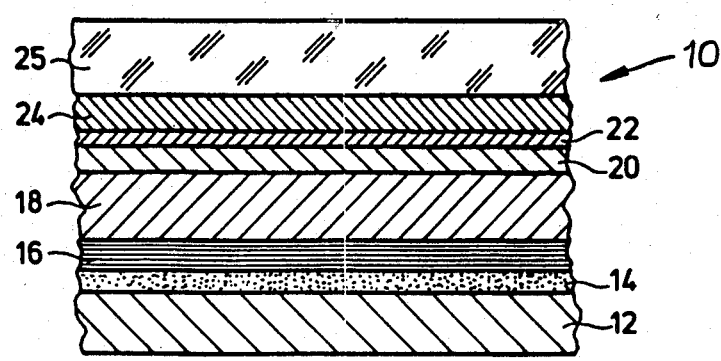
FIG. 1 is the diagrammatic view of a section of a solar cell.

In FIG. 1 a section of a copper sulfide-cadmium sulfide solar cell 10 is shown purely diagrammatically and in enlarged view.

On a substrate 12, which e.g., is cleaned in solvents by ultrasonics, an adhesive layer 14, e.g., evaporated chromium can be deposited, on which layer a first (backwall) electric contact 16 is formed. This contact can be made of silver and likewise be applied by evaporation.

Thereafter a layer of cadmium sulfide 18 is deposited on the silver layer 16 in a known manner from the vapor state. In order to reduce reflections and etch out grain boundaries, said cadmium-sulfide layer can be treated for a short time with aqueous hydrochloric acid. Subsequently, a copper sulfide layer 20 is generated on the cadmium sulfide layer 18. This can be effected by a chemical reaction by dipping into a monovalent copper-ion containing solution. The thickness of the copper sulfide layer 20 is about 0.2 $\mu$m, whereas the cadmium sulfide layer 18 has a thickness of 30 $\mu$m. One can then in addition apply a copper oxide layer ($Cu_{2-y}O$) to the copper sulfide layer 20. This can be effected by evaporating copper on the copper sulfide layer ($Cu_{2-x}S$), in order to subsequently be able, by thermal treatment, to fill up vacancies by diffusing copper into the copper sulfide layer 20 and to develop the copper oxide layer 22.

Thereafter a front-wall contacting system 24 as described below is arranged on the copper sulfide layer 20 or on the optional copper oxide layer 22. Finally, the front contact can be covered by a cover glass 25. Also, it should be mentioned that suitably designed solar cells can be connected to form modules.

Figure 2:
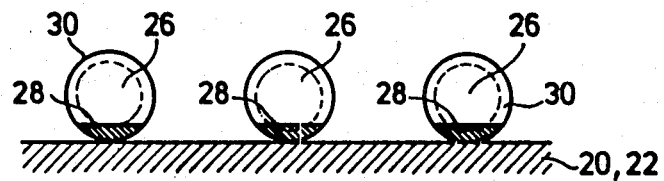
FIG. 2 is a first embodiment of a contacting system, and FIG. 3 a second embodiment of a contacting system.

The contacting system 24 can be composed of copper wires 26 arranged in parallel to each other, which guarantees good charge carrier transport. However, in order to prevent copper ions from the copper wires 26 from diffusing into layer 20 or layer 22, whereby cell efficiency would be negatively influenced, the contact region (28) to the front-wall semiconductor layers 20 or 22 is rendered passive. This can be done by chemical conversion into the material corresponding to that of the front-wall semiconductor layer. In the present case this means that the area 28 is converted into $Cu_{2-y}O$ or $Cu_{2-x}S$. Sulfidizing or oxidizing can take place by a wet chemical process or from the gas phase. The thickness of the layer produced in that manner is approximately 100 nm. Of course, it can be more advantageous with respect to industrial production if the surfaces of the wires are sulfidized or oxidized as a unit. In this case the circumferential layer of the wire 26 would then consist of copper sulfide or copper oxide. This layer is indicated by broken lines in FIG. 2 and has the reference number 30. The thickness of this layer will then be approximately 100 nm.

Still another possibility of forming a good ohmic front contact 24 to the semiconductor layers 20 or 22 facing the light source, without running the risk of a long term negative influence on the semiconductor layers due to ions diffusing from the front contact into the same, can be made by arranging an intermediate layer of a paste between the front contact, which can be composed wires or a grid, which paste will in addition form a reaction barrier between the front contact and the adjacent semiconductor layer.

Figure 3:
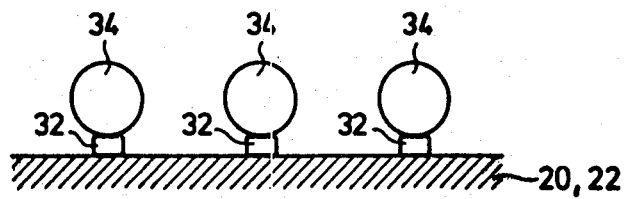

In FIG. 3 this intermediate layer has the reference number 32, where one can see that this layer, as compared to the deposited front contact shown by wires 34, can be of smaller extent areawise. Thereby it is guaranteed that the paste 32 will not cause any further shading of the semiconductor layers caused by the diameter of the wires. The thickness of the paste spots is 10 $\mu$m. In the embodiments according to FIGS. 2 and 3, the front contact is indicated as wires running parallelly to each other and having a diameter of 50 to 200 $\mu$m, but this front contact, of course, can also be a grid structure or the like.

As an intermediate layer 32, one can use conducting pastes such as e.g., graphite/soot conducting pastes or gilded graphite/soot conducting pastes or gold conducting pastes, that guarantee a good ohmic contact between the semiconductor layers 20 or 22 facing the light source and the front contact 34, where at the same time a reaction barrier is built up.

Another possibility of applying a grid-like front contact to the semiconductor layer facing the light source consists of depositing an adhesive over the entire surface, applying a copper grid, e.g., by silk screen printing, and subsequently removing those areas of the adhesive not covered by the grid. Still another possibility consists of applying selectively a paste as a resist to a conducting layer and subsequently removing the portions of the conductor not covered by the resist. Thereafter the resist can be deposited on the semiconductor layer as a reaction barrier so that in this manner the desired contact system will be formed. To this end especially suitable substances would be based on graphite/soot mixtures.

We claim:

1. A thin film solar cell with an upper semiconductor layer adapted to face a source of light and a front contact deposited on said semiconductor layer, wherein a passivation layer is deposited onto said front contact before said front contact is deposited onto said semiconductor layer, the chemical potential of said passivation layer being matched to the chemical potential of the semiconductor layer.

2. A thin film solar cell according to claim 1, wherein said front contact comprises the same material as said semiconductor layer, at least within the region of actual contact with said semiconductor layer.

3. A thin film solar cell according to claim 2 having an upper semiconductor layer of $Cu_2S$ or $Cu_2O$, adapted to face a source of light, a lower, contiguous CdS layer, and a front contact of copper deposited on said upper semiconductor layer, wherein at least that area of the copper front contact coming into contact with the semiconductor layer is respectively is sulfidized or oxidized.

* * * * *